United States Patent
Kadota et al.

(10) Patent No.: US 6,879,225 B2
(45) Date of Patent: Apr. 12, 2005

(54) SURFACE ACOUSTIC WAVE DEVICE

(75) Inventors: Michio Kadota, Kyoto (JP); Hideya Horiuchi, Nagaokakyo (JP); Takeshi Nakao, Nagaokakyo (JP); Yasuhiro Kuratani, Kyoto (JP); Masakazu Mimura, Nagaokakyo (JP); Junya Ago, Tomaya-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 104 days.

(21) Appl. No.: 10/610,925

(22) Filed: Jul. 1, 2003

(65) Prior Publication Data

US 2004/0061574 A1 Apr. 1, 2004

(30) Foreign Application Priority Data

Jul. 5, 2002 (JP) ................................ 2002-197451

(51) Int. Cl.[7] ............................. H03H 9/64; H03H 9/15
(52) U.S. Cl. ............... 333/193; 333/195; 310/313 A; 310/313 R
(58) Field of Search ......................... 333/193–196, 333/133; 310/313 A, 313 B, 313 C, 313 D, 313 R

(56) References Cited

U.S. PATENT DOCUMENTS

| | | | | |
|---|---|---|---|---|
| 6,104,260 A | * | 8/2000 | Yamada et al. | 333/193 |
| 6,297,713 B1 | * | 10/2001 | Kadota et al. | 333/133 |
| 6,366,002 B1 | * | 4/2002 | Kadota | 310/313 A |
| 6,518,861 B2 | * | 2/2003 | Taniguchi | 333/193 |
| 6,534,901 B1 | * | 3/2003 | Tsuzuki et al. | 310/348 |
| 6,809,614 B2 | * | 10/2004 | Fujii et al. | 333/193 |

FOREIGN PATENT DOCUMENTS

| | | | | |
|---|---|---|---|---|
| JP | 2-037815 | | 2/1990 | |
| JP | 8-265088 | | 10/1996 | |
| JP | 9-186542 | | 7/1997 | |
| JP | 2003124777 A | * | 4/2003 | .......... H03H/9/145 |
| JP | 2003309448 A | * | 10/2003 | ............ H03H/9/25 |
| JP | 2003332878 A | * | 11/2003 | ............ H03H/9/25 |

* cited by examiner

Primary Examiner—Vibol Tan
(74) Attorney, Agent, or Firm—Keating & Bennett, LLP

(57) ABSTRACT

A surface acoustic wave device includes a Y-cut, X-propagation $LiTaO_3$ substrate, at least one interdigital transducer provided on the $LiTaO_3$ substrate and made of Al or a metal containing Al as a major component, and an $SiO_2$ film provided on the surface of the $LiTaO_3$ substrate so as to cover the interdigital transducer, wherein the thickness Hs of the $SiO_2$ film normalized by the wavelength $\lambda$ of a surface acoustic wave and the cut angle $\theta$ of the $LiTaO_3$ substrate are set to be in any one of the ranges represented by formulae (1) to (8):

| | |
|---|---|
| in the case of $0.00 < Hs \leq 0.05$, $30° < \theta < 36°$ | (1) |
| in the case of $0.05 < Hs \leq 0.10$, $29° < \theta < 36°$ | (2) |
| in the case of $0.10 < Hs \leq 0.15$, $28° < \theta < 36°$ | (3) |
| in the case of $0.15 < Hs \leq 0.20$, $27° < \theta < 36°$ | (4) |
| in the case of $0.20 < Hs \leq 0.25$, $26° < \theta < 36°$ | (5) |
| in the case of $0.25 < Hs \leq 0.30$, $25° < \theta < 35°$ | (6) |
| in the case of $0.30 < Hs \leq 0.35$, $23° < \theta < 34°$ | (7) |
| in the case of $0.35 < Hs \leq 0.40$, $21° < \theta < 31°$ | (8) |

16 Claims, 9 Drawing Sheets

SURFACE ACOUSTIC WAVE DEVICE

BACKGROUND OF THE INVENTION

1. Field of the Invention

The present invention relates to a surface acoustic wave device for use as a resonator, a band-filter, or other suitable device, and more particularly, to a surface acoustic wave device including electrodes of Al or a metal containing Al as a major component which are formed on an $LiTaO_3$ substrate, and which include a protection layer formed of an $SiO_2$ film.

2. Description of the Related Art

Previously, 36° and 39.5° to 46° rotated Y-cut X-propagation $LiTaO_3$ substrates have been widely used as surface acoustic wave substrates for use in surface acoustic wave devices. For high frequency surface acoustic wave filters including such surface acoustic wave substrates, Al or Al base alloys have been used as major components of the electrode materials. For surface acoustic wave devices of this type, the film thicknesses of interdigital transducers (IDTs), which are normalized by the wavelength $\lambda$ of a surface acoustic wave, are relatively large, i.e., in the range of about 0.08 to about 0.10.

In such devices, it is well known that an $SiO_2$ film is provided to improve the temperature characteristics and also to protect the electrodes, such as the IDTs, or other suitable electrodes. For example, Japanese Unexamined Patent Application Publication Nos. 2-37815, 8-265088, and 9-186542 disclose surface acoustic wave devices in which an $SiO_2$ film is provided.

Of these surface acoustic wave devices, the surface acoustic wave filter described in Japanese Unexamined Patent Application Publication No. 9-186542 includes reflectors provided on both sides in the surface acoustic wave propagation direction of an area including at least two IDTs. An $SiO_2$ film having a predetermined thickness is arranged so as to cover the IDTs and the reflectors. Japanese Unexamined Patent Application Publication No. 9-186542 discloses that not only the electrodes are protected, but also the band-width is increased when the $SiO_2$ film is provided.

However, problematically, when an $SiO_2$ film is provided in a surface acoustic wave device, the insertion loss is deteriorated due to the addition of the $SiO_2$ film.

SUMMARY OF THE INVENTION

To overcome the problems described above, preferred embodiments of the present invention provide a surface acoustic wave device including an IDT made of Al or a metal containing Al as a major component provided on a Y-cut, X-propagation $LiTaO_3$ substrate, and an $SiO_2$ film arranged so as to cover the IDT, such that the $SiO_2$ film protects an electrode and improves the temperature characteristics of the device, and in which the insertion loss is greatly reduced.

According to a preferred embodiment of the present invention, a surface acoustic wave device includes a Y-cut, X-propagation $LiTaO_3$ substrate, at least one interdigital transducer provided on the $LiTaO_3$ substrate and made of Al or a metal containing Al as a major component, and an $SiO_2$ film arranged on the surface of the $LiTaO_3$ substrate so as to cover the interdigital transducer, wherein the thickness Hs of the $SiO_2$ film normalized by the wavelength $\lambda$ of a surface acoustic wave and the cut angle $\theta$ of the $LiTaO_3$ substrate are set to be in any one of the ranges represented by formulae (1) to (8):

in the case of $0.00 < Hs \leq 0.05$, $30° < \theta < 36°$     (1)

in the case of $0.05 < Hs \leq 0.10$, $29° < \theta < 36°$     (2)

in the case of $0.10 < Hs \leq 0.15$, $28° < \theta < 36°$     (3)

in the case of $0.15 < Hs \leq 0.20$, $27° < \theta < 36°$     (4)

in the case of $0.20 < Hs \leq 0.25$, $26° < \theta < 36°$     (5)

in the case of $0.25 < Hs \leq 0.30$, $25° < \theta < 35°$     (6)

in the case of $0.30 < Hs \leq 0.35$, $23° < \theta < 34°$     (7)

in the case of $0.35 < Hs \leq 0.40$, $21° < \theta < 31°$     (8)

According to this preferred embodiment of the present invention, the thickness Hs of the $SiO_2$ film is preferably set to be in the above-described ranges. Therefore, although the $SiO_2$ film is provided to improve the temperature characteristic and protect the electrodes, such as IDTs, the attenuation constant $\alpha$ for a surface acoustic wave is decreased, and thereby, the deterioration of the insertion loss is reduced, as seen in the experimental examples described below.

Preferably, the film thickness Ha of the interdigital transducer is about 0.04 or less, and more preferably, about 0.03 or less. Thereby, the size of the concavities and convexities at the surface of the $SiO_2$ film are reduced, and also, the attenuation constant $\alpha$ is further decreased. Thus, the deterioration of the insertion loss is more effectively reduced.

Also, preferably, the normalized film thickness Hs of the $SiO_2$ film is in the range of about 0.15 to about 0.4. In this case, the temperature characteristic TCF is in the range of about −15 ppm/°C. to about +15 ppm/°C. Thus, a sufficient temperature characteristic is obtained.

The surface acoustic wave device according to preferred embodiments of the present invention may be provided with a reflector electrode or without a reflector electrode. When the surface acoustic wave device has a reflector, the reflector is defined by a reflector electrode provided on the $LiTaO_3$ substrate. When the surface acoustic wave device does not include a reflector electrode, an end surface reflection type surface acoustic wave device is provided. Instead of providing the reflector, an end surface of the $LiTaO_3$ substrate defines a reflector and the end surface of the substrate reflects the surface acoustic wave. In end surface reflection type surface acoustic wave devices, a spurious component outside the passband tends to be produced. However, according to preferred embodiments of the present invention, the out-of-band spurious is effectively suppressed by the $SiO_2$ film having a thickness in the above-described ranges.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

The present invention will be more apparent from the following description made with reference to the specific preferred embodiments of the present invention.

Figure 1:
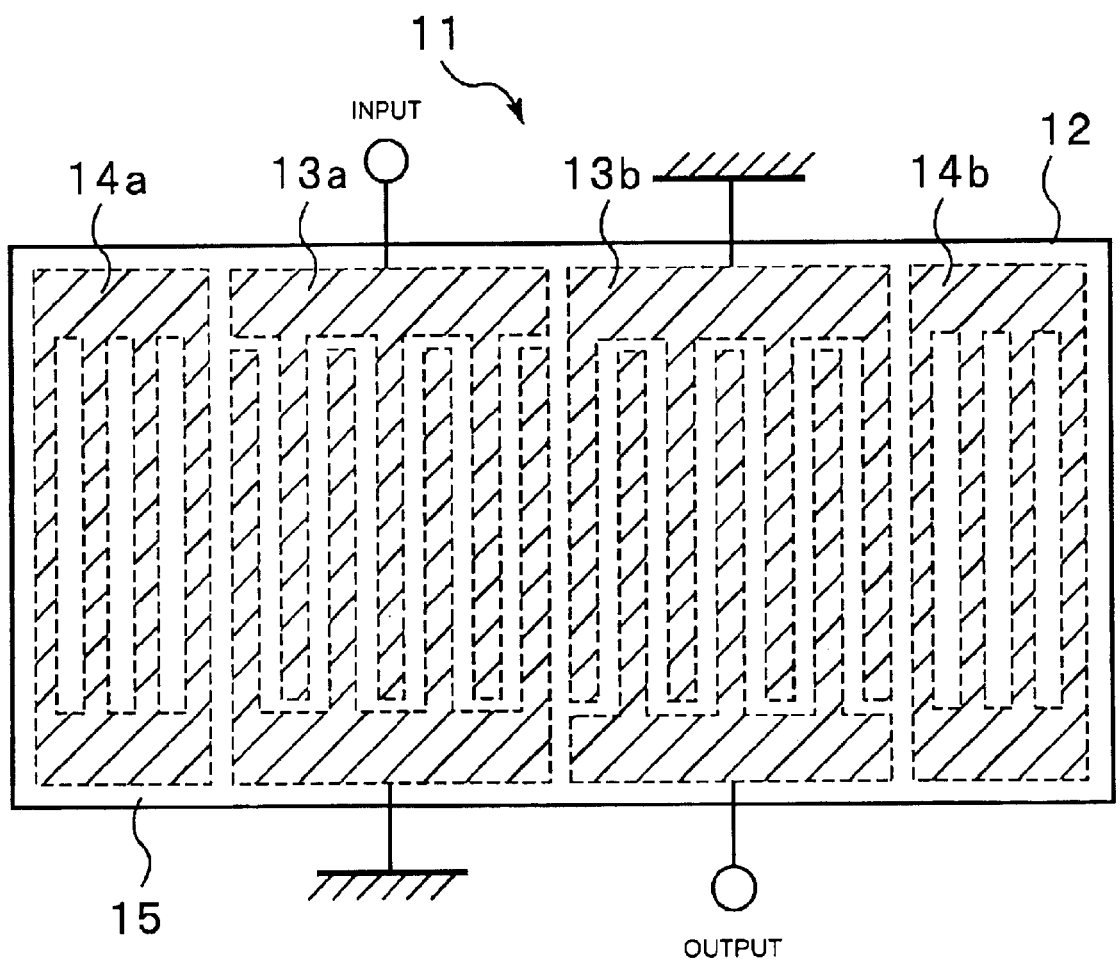
FIG. 1 is a plan view of a longitudinally coupled surface acoustic wave filter as a surface acoustic wave device according to a first preferred embodiment of the present invention.

FIG. 1 is a plan view of a surface acoustic wave device according to a first preferred embodiment of the present invention.

A surface acoustic wave device 11 includes IDTs 13a and 13b and reflectors 14a and 14b on the upper surface of an LiTaO$_3$ substrate 12. An SiO$_2$ film 15 is arranged so as to cover the IDTs 13a and 13b and the reflectors 14a and 14b.

As the LiTaO$_3$ substrate 12, a Y-cut, X-propagation LiTaO$_3$ substrate is preferably used. The IDTs 13a and 13b and the reflectors 14a and 14b are preferably made of Al or a metal containing Al as a major component.

According to this preferred embodiment, the thickness Hs of the SiO$_2$ film normalized by the wavelength λ of a surface acoustic wave and the cut angle θ of the LiTaO$_3$ substrate are preferably set to be in the following ranges:

in the case of 0.00<Hs≦0.05, 30°<θ<36°  (1)

in the case of 0.05<Hs≦0.10, 29°<θ<36°  (2)

in the case of 0.10<Hs≦0.15, 28°<θ<36°  (3)

in the case of 0.15<Hs≦0.20, 27°<θ<36°  (4)

in the case of 0.20<Hs≦0.25, 26°<θ<36°  (5)

in the case of 0.25<Hs≦0.30, 25°<θ<35°  (6)

in the case of 0.30<Hs≦0.35, 23°<θ<34°  (7)

in the case of 0.35<Hs≦0.40, 21°<θ<31°  (8)

As seen in the following experimental examples, the deterioration of the insertion loss of the surface acoustic wave device 11 according to this example is greatly reduced, when the thickness Hs of the SiO2 film 15 is set to be in the above-described ranges.

Figure 2:
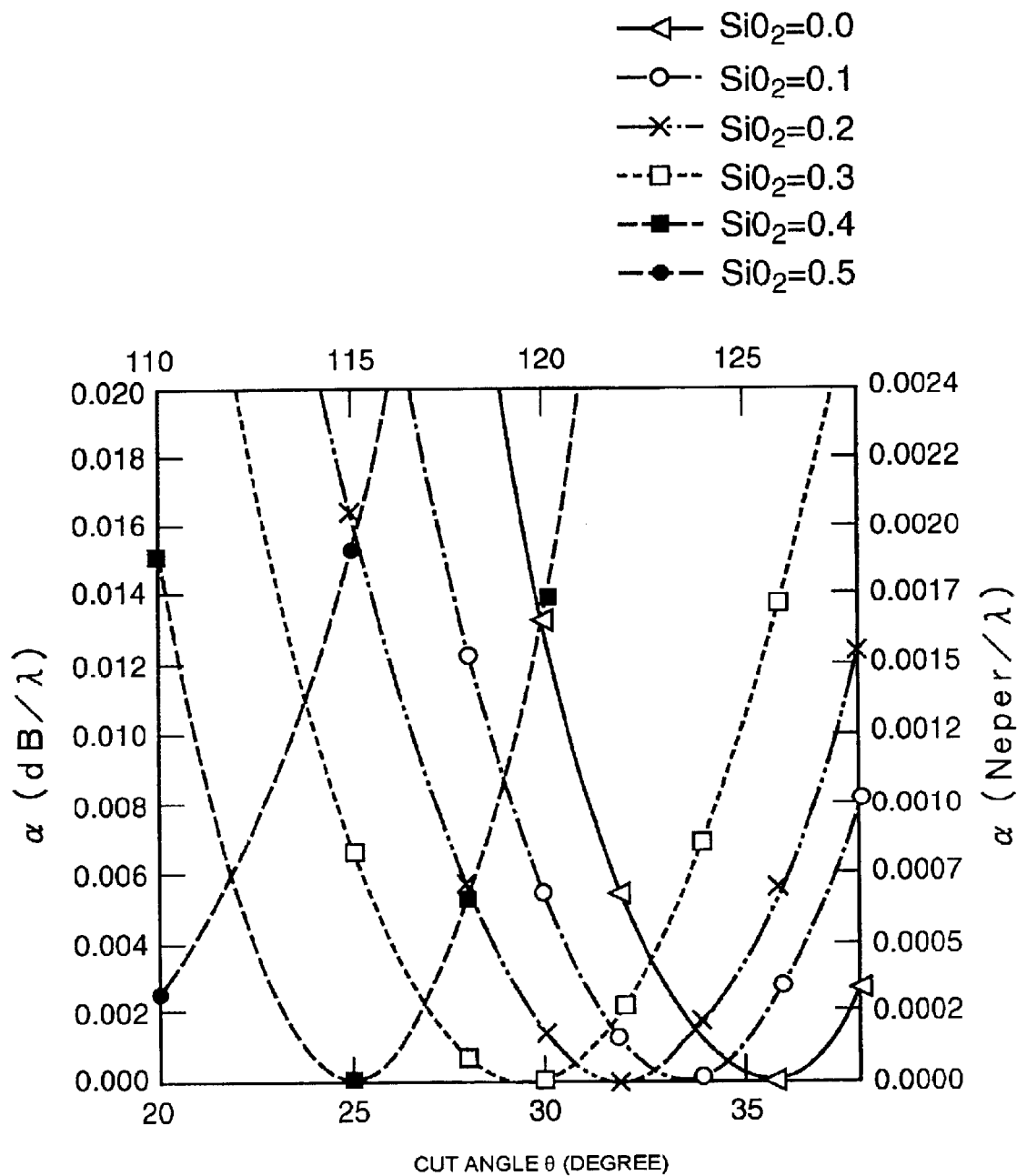
FIG. 2 is a graph showing a relationship between the cut angle $\theta$ of an $LiTaO_3$ substrate and the attenuation constant $\alpha$, obtained when the normalized film thickness Ha of an IDT is about 0.01, and $SiO_2$ films with different film thicknesses are provided.
Figure 3:
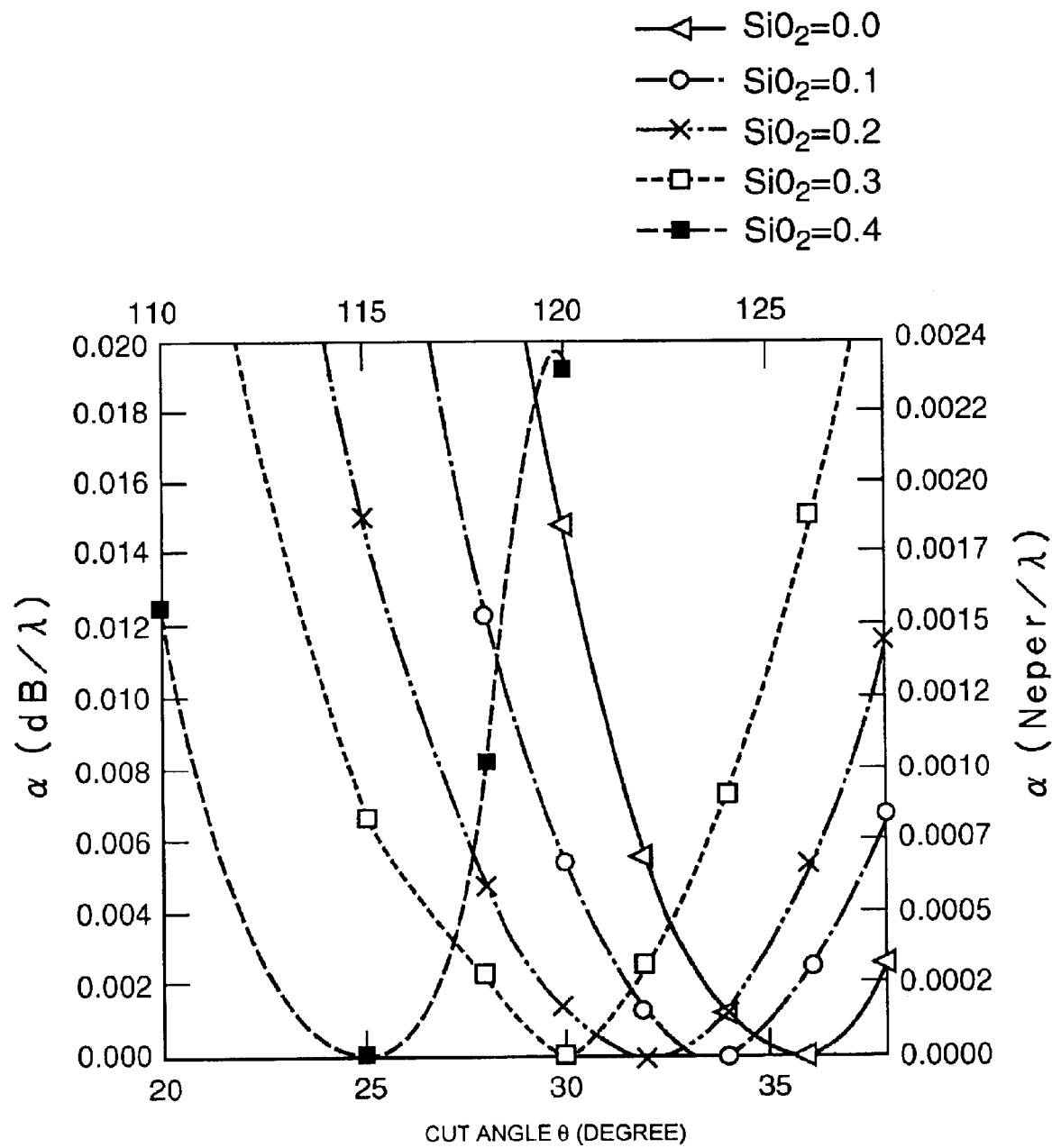
FIG. 3 is a graph showing a relationship between the cut angle $\theta$ of an $LiTaO_3$ substrate and the attenuation constant α, obtained when the normalized film thickness Ha of an IDT is about 0.02, and SiO$_2$ films with different film thicknesses are provided.
Figure 4:
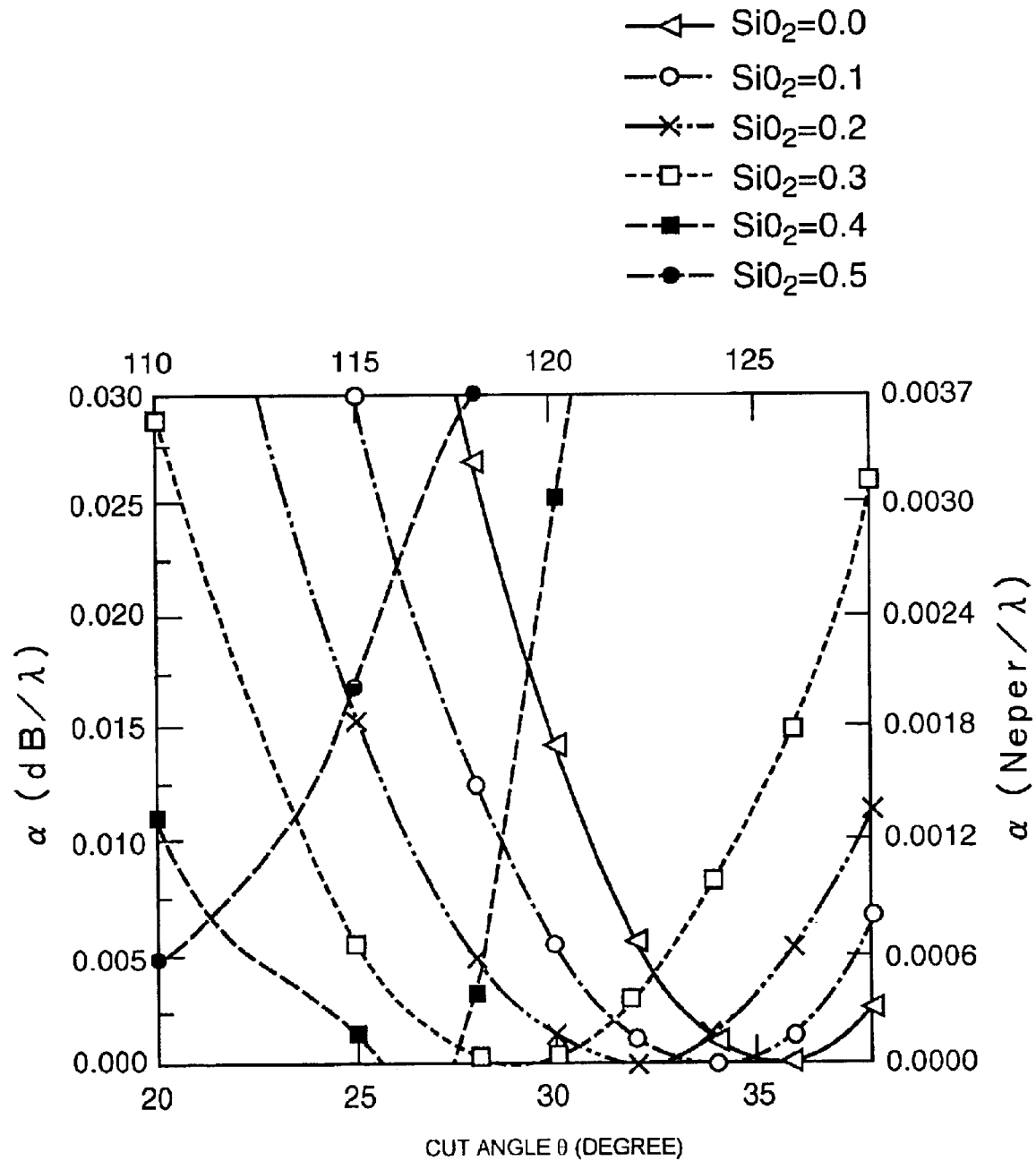
FIG. 4 is a graph showing a relationship between the cut angle θ of an LiTaO$_3$ substrate and the attenuation constant α, obtained when the normalized film thickness Ha of an IDT is about 0.03, and SiO$_2$ films with different film thicknesses are provided.

In the case in which at least one IDT is formed on a 39.5° rotated Y-cut X-propagation LiTaO3 substrate, and an SiO2 film is provided to improve the frequency-temperature characteristics, the insertion loss deteriorates. The inventors of the present invention have investigated the causes for the deterioration of the insertion loss. As a result, it was discovered that the formation of the SiO2 film causes the attenuation constant α for a surface acoustic wave to increase, and thereby, the insertion loss deteriorates. Thus, a change of the attenuation constant α was investigated by varying the cut angle θ of an LiTaO$_3$ substrate, the normalized film thickness Ha of an electrode such as an IDT made of Al, and the normalized thickness Hs of an SiO$_2$ film. FIGS. 2 to 4 show the results.

FIGS. 2 to 4 show the results obtained at normalized film thicknesses Ha of the IDT of about 0.01, about 0.02, and about 0.03. Also, FIGS. 2 to 4 show the relationships between the cut angle θ of the substrate and the attenuation constant α, obtained when the SiO$_2$ films with different normalized film thicknesses Hs were provided.

As seen in FIG. 2, the attenuation constant α is minimized at a cut angle θ of about 36°, when the normalized thickness Hs of the SiO$_2$ film is about zero, and the attenuation constant α increases as the normalized film thickness Hs is increased. On the other hand, the cut angle θ at which the attenuation constant α is minimized is gradually decreased as the film thickness Hs of the LiTaO$_3$ substrate is increased. This tendency seen in FIG. 2 is also found in FIGS. 3 and 4.

Thus, the following are shown: in the case of the different normalized film thicknesses Ha of an IDT, the attenuation constant α, which is increased by the formation of the SiO$_2$ film, can be set substantially at zero by using a LiTaO$_3$ substrate 12 having a smaller cut angle as compared to a cut angle generally used in the related art, and moreover, the cut angle θ at which the attenuation constant α is set substantially at zero depends on the normalized film thickness Hs of the SiO$_2$ film.

Figure 5:
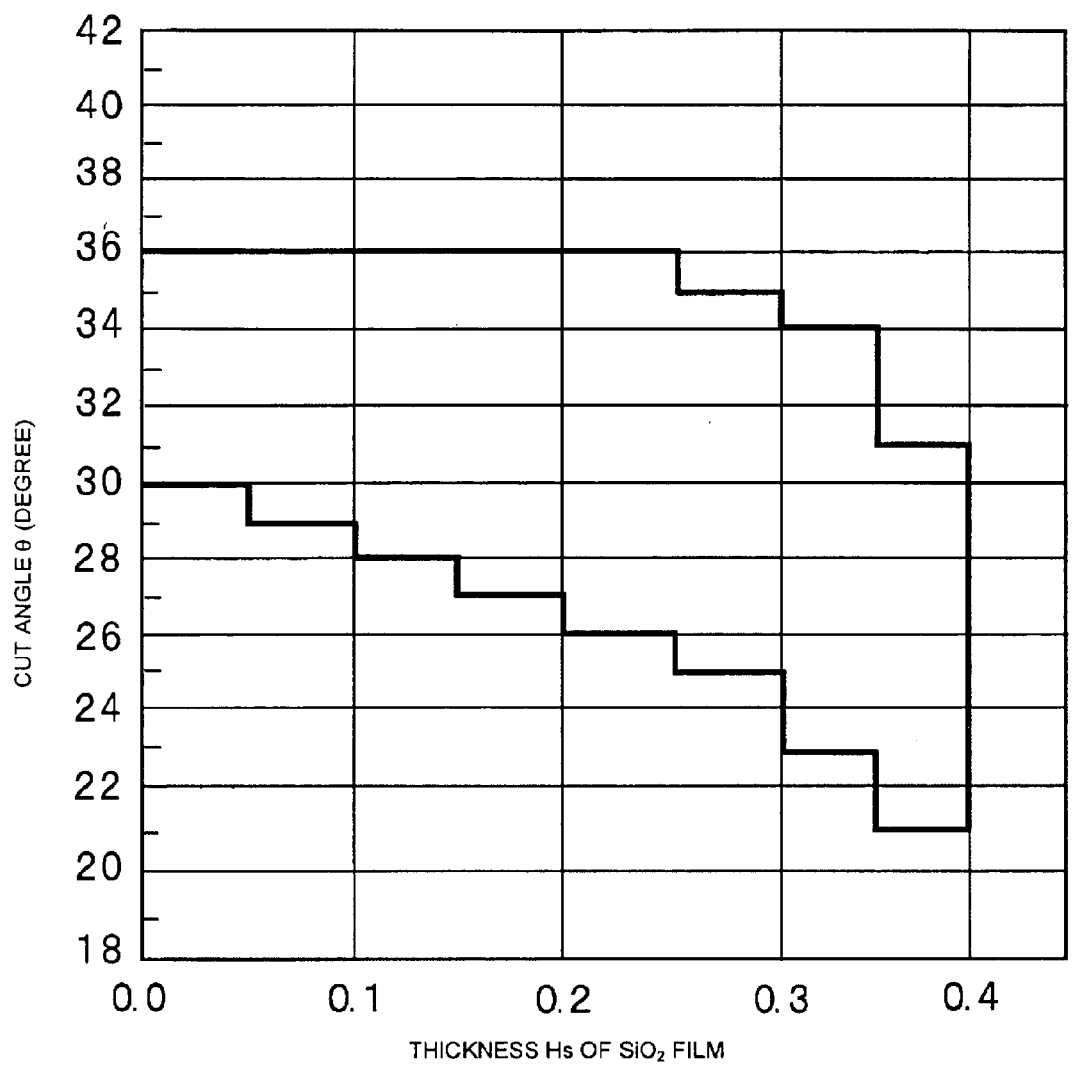
FIG. 5 is a graph showing the ranges of the normalized film thickness Hs of an SiO$_2$ film and the cut angle θ in which the attenuation constant α is in the range of up to about 0.001 Neper/λ.

Considering the results shown in FIGS. 2 to 4, IDTs with different normalized film thicknesses Hs were formed. Investigation similar to that described in reference to FIGS. 2 to 4 was made. FIG. 5 shows the results.

If the thickness Hs of the SiO$_2$ film and the cut angle θ are set to be in the range surrounded by the bold line in FIG. 5, the attenuation constant α is set at about 0.001 Neper/λ, such that the deterioration of the insertion loss is effectively reduced. The range surrounded by the bold line in FIG. 5 represents the range defined by the above-described formulae (1) to (8).

In particular, the attenuation constant α is reduced by selecting the film thickness Hs and the cut angle θ in any one of the ranges satisfying the formulae (1) to (8). Thus, in a surface acoustic wave device in which an SiO$_2$ film is provided to protect an IDT and improve the temperature characteristic TCF, the deterioration of the insertion loss is greatly reduced.

Moreover, the inventors of the present invention investigated the effects of the film thickness Ha of an electrode such as an IDT made of Al or a metal containing Al as a major component. A one-port type surface acoustic wave resonator was produced using a piezoelectric substrate formed of a LiTaO$_3$ substrate with a cut angle of 36°. The IDT was formed of Al. The normalized film thickness Ha of the IDT was varied in the range of about 0.01λ to about 0.08λ, and the normalized film thickness Hs of the $SiO_2$ film was varied in the range of about 0 to about 0.3λ. The resonance resistances Rr of the produced one-port type surface acoustic wave resonators were determined. It is known that the resonance resistance Rr of a surface acoustic wave resonator is associated with the deterioration of the insertion loss as a filter characteristic.

Figure 6:
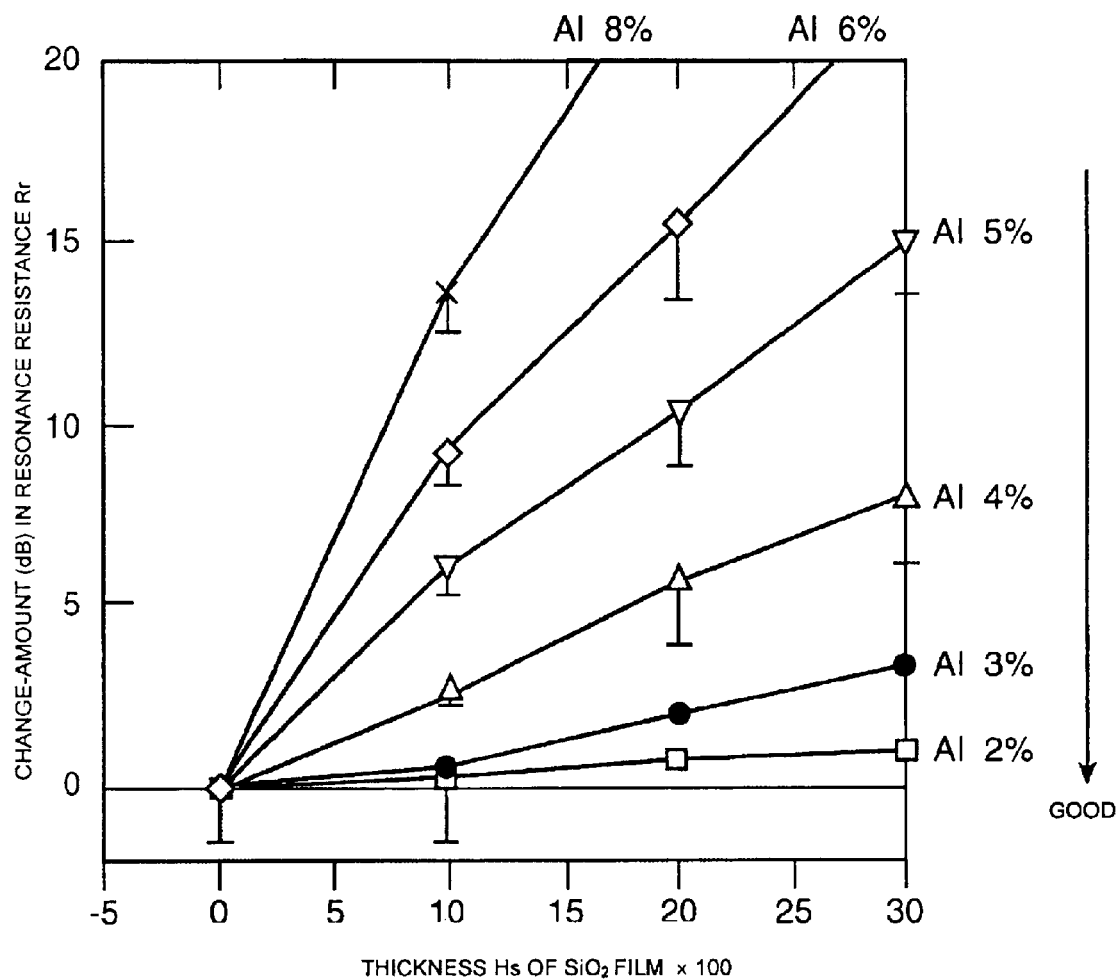
FIG. 6 is a graph showing a relationship between the normalized film thickness Hs of an SiO$_2$ film and the change-amount of the resonance resistance Rr of one-port type surface acoustic wave resonator in which IDTs of Al having different normalized film thicknesses Ha are provided.

FIG. 6 shows the relationship between the normalized film thickness Ha of an $SiO_2$ film and the change-amount of the resonance resistance Rr in surface acoustic wave resonators having IDTs with different normalized film thicknesses Ha.

As seen in FIG. 6, the change-amount of the resonance resistance Rr, caused by the increase of the thickness of the $SiO_2$ film, is very large when the normalized film thickness Ha of the IDT is greater than about 0.04. Accordingly, the change of the resonance resistance Rr, caused by increasing of the normalized film thickness Hs of the formed $SiO_2$ film is suppressed by setting the normalized film thickness Ha of the IDT preferably at about 0.04 or less, and more preferably at about 0.03 or less. Thus, according to preferred embodiments of the present invention, preferably, the normalized film thickness Hs of the IDT is equal to or less than about 0.04, and more preferably, equal to or less than about 0.03. Thus, a surface acoustic wave device of which the deterioration of the characteristics is greatly reduced is provided by selecting the cut angle θ of the piezoelectric substrate and the normalized film thickness Hs of the $SiO_2$ film in any one of the ranges defined by the formulae (1) to (8).

Figure 7:
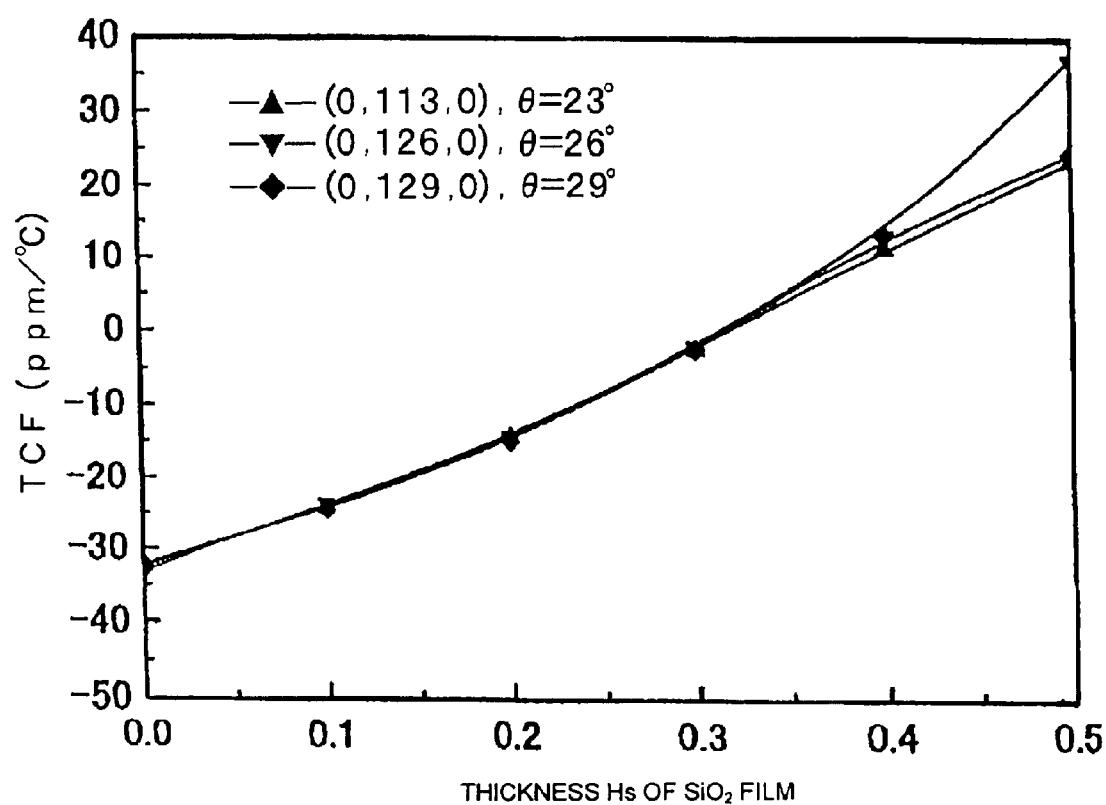
FIG. 7 is a graph showing a relationship between the normalized film thickness Hs of an SiO$_2$ film and the temperature characteristic TCF, obtained when LiTaO$_3$ substrates with cut angles θ of approximately 23°, 26°, and 29° are used.

Furthermore, the inventors of the present invention investigated the change of the temperature characteristic TCF, caused when the thickness Hs of the $SiO_2$ film is varied. FIG. 7 shows the results.

FIG. 7 shows the relationship between the normalized film thickness Hs of the $SiO_2$ film and the temperature characteristic TCF in the surface acoustic wave devices of the first preferred embodiment which are formed using the rotation Y plate X propagation $LiTaO_3$ substrates with cut angles of 23°, 26°, and 29°.

As seen in FIG. 7, in all of the cases of cut angles of 23°, 26°, and 29°, the temperature characteristics TCF can be set to be within about ±15°, provided that the normalized film thickness Hs of the $SiO_2$ film is in the range of about 0.15 to about 0.40. In the surface acoustic wave device according to preferred embodiments of the present invention configured to satisfy the ranges defined by the formulae (1) to (8), the normalized film thickness Hs of the $SiO_2$ film is set to be in the range of about 0.15 to about 0.40 to obtain a sufficient temperature characteristic in addition to suppressing the deterioration of the insertion loss.

Figure 8:
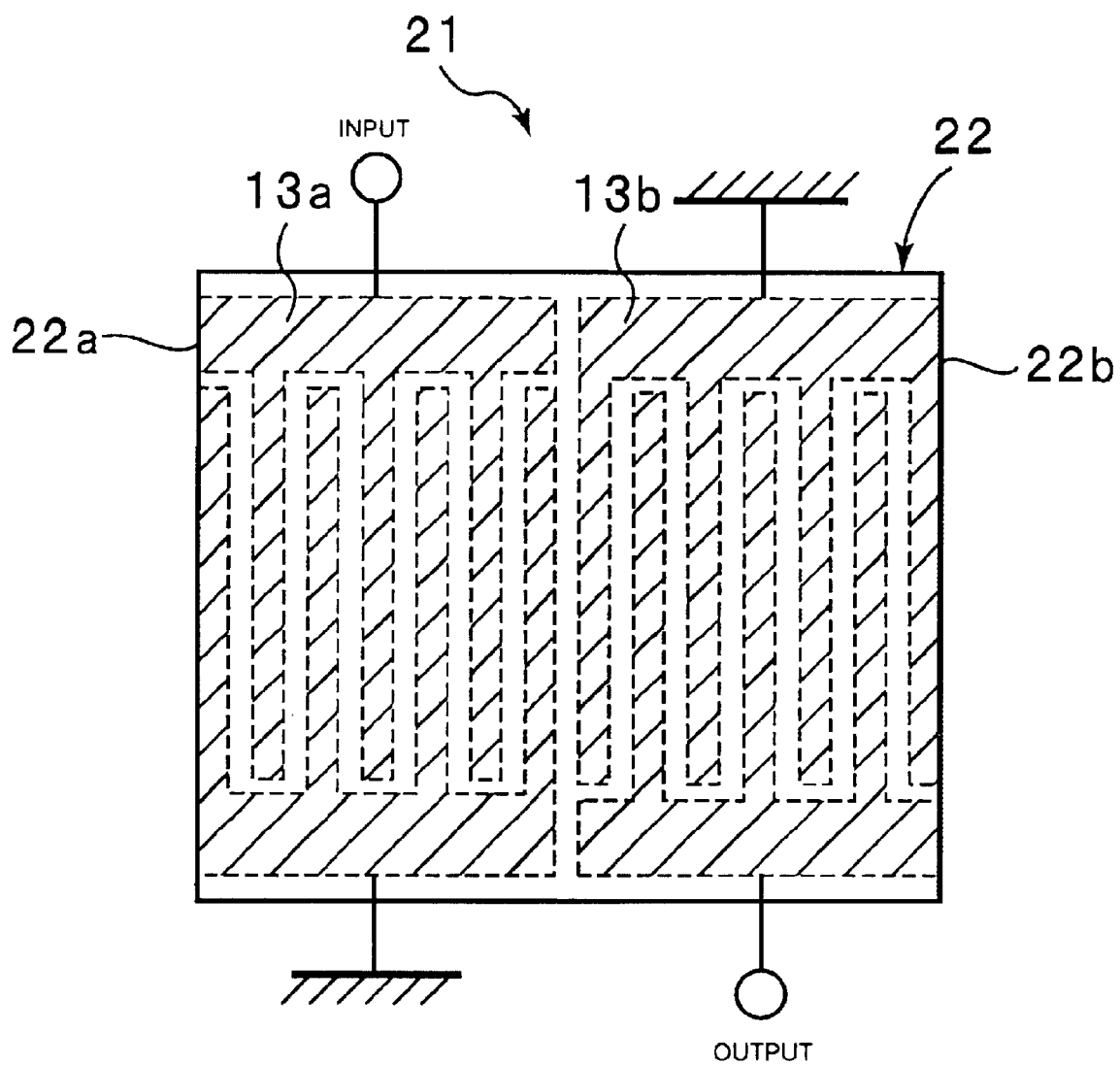
FIG. 8 is a plan view of an end surface reflection type longitudinally coupled type surface acoustic wave filter according to a second preferred embodiment of the present invention.

FIG. 8 is a schematic plan view of an end surface reflection type longitudinally coupled resonator filter according to a second preferred embodiment of the present invention. A surface acoustic wave filter 21 is configured in the same manner as the surface acoustic wave device 11 shown in FIG. 11, except that a pair of the end surfaces of the $LiTaO_3$ substrate define reflection end surfaces 14a and 14b instead of the reflectors 14a and 14b of the surface acoustic wave device 11 of FIG. 1. That is, the surface acoustic wave device 21 is an end surface reflection type surface acoustic wave filter which is operated with an SH type surface acoustic wave.

Figure 9:
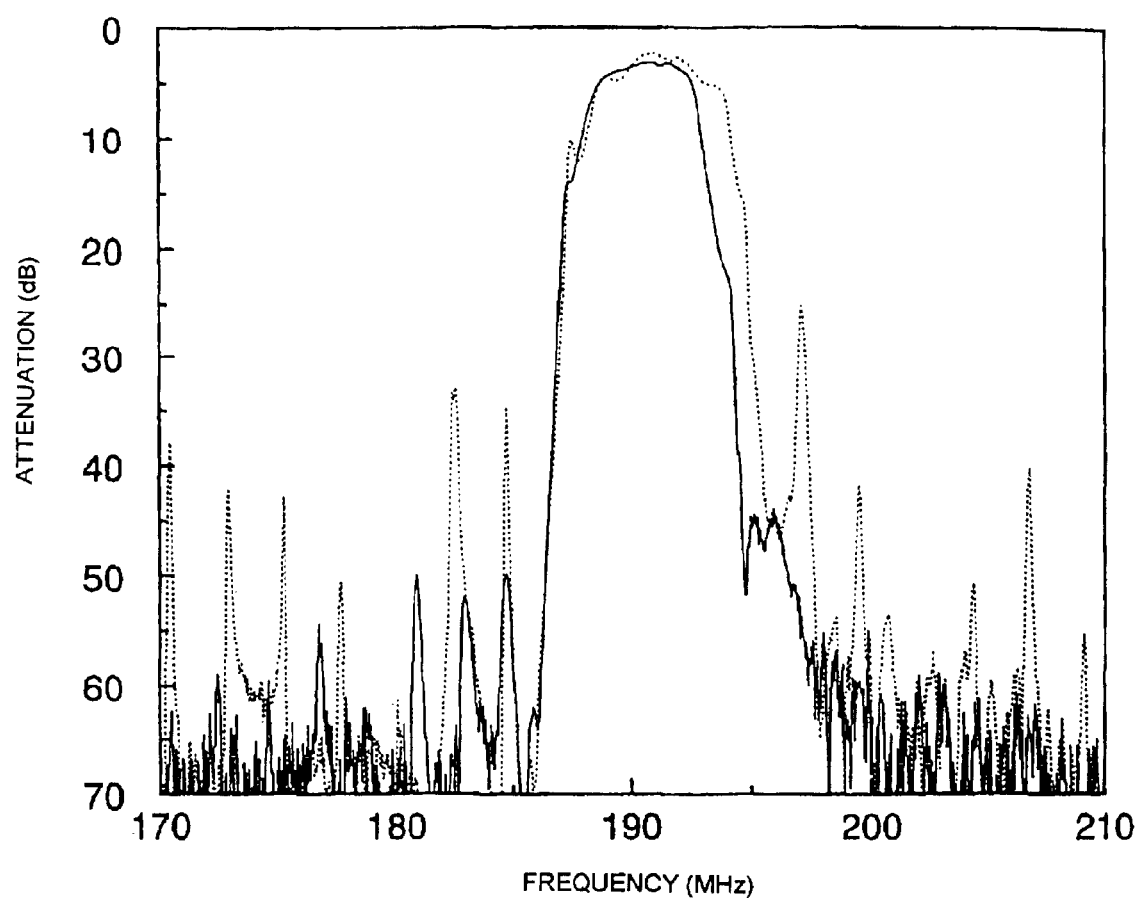
FIG. 9 is a graph showing the attenuation-frequency characteristics of the surface acoustic wave filter of the second preferred embodiment and a surface acoustic wave device prepared for comparison.

The surface acoustic wave device was produced, and the attenuation-frequency characteristic was measured. FIG. 9 shows the results. In FIG. 9, the solid line represents the attenuation-frequency characteristic of the surface acoustic wave filter according to the second preferred embodiment of the present invention. In this case, as the $LiTaO_3$ substrate, a 36° rotated Y-cut X-propagation $LiTaO_3$ substrate was used. The IDT was made of Al. The film thickness Ha was about 0.017, and the thickness Hs of the $SiO_2$ film was about 0.3.

The broken line in FIG. 9 represents the attenuation-frequency characteristic of an end surface reflection type surface acoustic wave filter prepared for comparison. The surface acoustic wave filter as the comparative example was formed in the same manner as the surface acoustic wave filter of the second preferred embodiment except that the $SiO_2$ film was not provided.

As seen in FIG. 9, in the surface acoustic wave filter according to the second preferred embodiment in which the $SiO_2$ film is provided, the deterioration of the insertion loss is greatly reduced. Moreover, in the comparative example, the out-of-band spurious response is increased. On the other hand, in the end surface reflection type surface acoustic wave filter according to the second preferred embodiment, the out-of-band spurious response is effectively suppressed. This is due to the fact that the out-of-band spurious which appears in the end surface reflection type surface acoustic wave device is suppressed by the $SiO_2$ film. In the second preferred embodiment, the cut angle θ is preferably set at 36°. However, it has been ascertained that the same effects are obtained at other cut angles θ.

Thus, in the case of the end surface reflection type surface acoustic wave device according to preferred embodiments of the present invention, the out-of-band spurious response specific to an end surface reflection type surface acoustic wave device is effectively suppressed by the $SiO_2$ film.

The present invention is not restricted to the above-described longitudinally coupled resonator type surface acoustic wave filter and one port type surface acoustic wave resonator, and can be applied to different types of surface acoustic wave devices with reflectors and surface acoustic wave devices having no reflectors.

The IDT is not necessarily made of Al only, and may be made of an Al base alloy.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:
   a Y-cut, X-propagation $LiTaO_3$ substrate;
   at least one interdigital transducer provided on the $LiTaO_3$ substrate and made of Al or a metal containing Al as a major component; and
   an $SiO_2$ film arranged on the surface of the $LiTaO_3$ substrate so as to cover the at least one interdigital transducer; wherein
   the thickness Hs of the $SiO_2$ film normalized by the wavelength λ of a surface acoustic wave and the cut angle θ of the $LiTaO_3$ substrate are set to be in any one of the ranges represented by formula (1) to (8):

in the case of $0.00 < Hs \leq 0.05$, $30° < θ < 36°$     (1)

in the case of $0.05 < Hs \leq 0.10$, $29° < θ < 36°$     (2)

in the case of $0.10 < Hs \leq 0.15$, $28° < θ < 36°$     (3)

in the case of $0.15 < Hs \leq 0.20$, $27° < θ < 36°$     (4)

in the case of $0.20 < Hs \leq 0.25$, $26° < \theta < 36°$ (5)

in the case of $0.25 < Hs \leq 0.30$, $25° < \theta < 35°$ (6)

in the case of $0.30 < Hs \leq 0.35$, $23° < \theta < 34°$ (7)

in the case of $0.35 < Hs \leq 0.40$, $21° < \theta < 31°$ (8).

2. A surface acoustic wave device according to claim 1, wherein the film thickness Ha of the interdigital transducer normalized by the wavelength λ of a surface acoustic wave is about 0.04 or less.

3. A surface acoustic wave device according to claim 1, wherein the film thickness Ha of the interdigital transducer normalized by the wavelength λ of a surface acoustic wave is about 0.03 or less.

4. A surface acoustic wave device according to claim 1, wherein the normalized film thickness Hs of the SiO₂ film is in the range of about 0.15 to about 0.4.

5. A surface acoustic wave device according to claim 1, further comprising at least one reflector provided on the LiTaO₃ substrate.

6. A surface acoustic wave device according to claim 5, wherein the surface acoustic wave device is an end surface reflection type surface acoustic wave device in which an end surface of the LiTaO₃ substrate defines the at least one reflector.

7. A surface acoustic wave device according to claim 5, wherein said at least one reflector includes two reflector electrodes disposed on opposite sides of said at least one interdigital electrode in a propagation direction of a surface acoustic wave.

8. A surface acoustic wave device according to claim 7, wherein said SiO₂ film is provided on said two reflector electrodes.

9. A method of manufacturing a surface acoustic wave device comprising the steps of:

provide a Y-cut, X-propagation LiTaO₃ substrate;

forming at least one interdigital transducer made of Al or a metal containing Al as a major component on the LiTaO₃ substrate;

forming an SiO₂ film on the surface of the LiTaO₃ substrate so as to cover the at least one interdigital transducer; and setting the thickness Hs of the SiO₂ film normalized by the wavelength λ of a surface acoustic wave and the cut angle θ of the LiTaO₃ substrate to be in any one of the ranges represented by formula (1) to (8):

in the case of $0.00 < Hs \leq 0.05$, $30° < \theta < 36°$ (1)

in the case of $0.05 < Hs \leq 0.10$, $29° < \theta < 36°$ (2)

in the case of $0.10 < Hs \leq 0.15$, $28° < \theta < 36°$ (3)

in the case of $0.15 < Hs \leq 0.20$, $27° < \theta < 36°$ (4)

in the case of $0.20 < Hs \leq 0.25$, $26° < \theta < 36°$ (5)

in the case of $0.25 < Hs \leq 0.30$, $25° < \theta < 35°$ (6)

in the case of $0.30 < Hs \leq 0.35$, $23° < \theta < 34°$ (7)

in the case of $0.35 < Hs \leq 0.40$, $21° < \theta < 31°$ (8).

10. A method of manufacturing a surface acoustic wave device according to claim 9, further comprising the step of setting the film thickness Ha of the interdigital transducer normalized by the wavelength λ of a surface acoustic wave to about 0.04 or less.

11. A method of manufacturing a surface acoustic wave device according to claim 9, further comprising the step of setting the film thickness Ha of the interdigital transducer normalized by the wavelength λ of a surface acoustic wave to about 0.03 or less.

12. A method of manufacturing a surface acoustic wave device according to claim 9, wherein the normalized film thickness Hs of the SiO₂ film is set to be in the range of about 0.15 to about 0.4.

13. A method of manufacturing a surface acoustic wave device according to claim 9, further comprising the step of providing at least one reflector on the LiTaO₃ substrate.

14. A method of manufacturing a surface acoustic wave device according to claim 13, wherein the surface acoustic wave device is an end surface reflection type surface acoustic wave device in which an end surface of the LiTaO₃ substrate defines the at least one reflector.

15. A method of manufacturing a surface acoustic wave device according to claim 13, wherein said at least one reflector includes two reflector electrodes disposed on opposite sides of said at least one interdigital electrode in a propagation direction of a surface acoustic wave.

16. A method of manufacturing a surface acoustic wave device according to claim 15, wherein said SiO₂ film is formed on said two reflector electrodes.

* * * * *